United States Patent
Simsek-Ege et al.

(10) Patent No.: US 10,141,322 B2
(45) Date of Patent: Nov. 27, 2018

(54) METAL FLOATING GATE COMPOSITE 3D NAND MEMORY DEVICES AND ASSOCIATED METHODS

(71) Applicant: Intel Corporation, Santa Clara, CA (US)

(72) Inventors: Fatma A. Simsek-Ege, Boise, ID (US); Nirmal Ramaswamy, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 701 days.

(21) Appl. No.: 14/109,230

(22) Filed: Dec. 17, 2013

(65) Prior Publication Data
US 2015/0171098 A1    Jun. 18, 2015

(51) Int. Cl.
| H01L 29/788 | (2006.01) |
| H01L 27/11556 | (2017.01) |
| H01L 21/28 | (2006.01) |
| H01L 27/11524 | (2017.01) |

(52) U.S. Cl.
CPC .. *H01L 27/11556* (2013.01); *H01L 21/28273* (2013.01); *H01L 27/11524* (2013.01)

(58) Field of Classification Search
CPC .......................... H01L 27/115; H01L 21/28273
See application file for complete search history.

(56) References Cited

U.S. PATENT DOCUMENTS

| 2007/0132004 A1* | 6/2007 | Yasuda ............. H01L 21/28273 257/315 |
| 2009/0140317 A1 | 6/2009 | Rosmeulen |
| 2010/0003795 A1 | 1/2010 | Park et al. |
| 2010/0097859 A1 | 4/2010 | Shim et al. |
| 2011/0065270 A1 | 3/2011 | Shim et al. |
| 2011/0294290 A1 | 12/2011 | Nakanishi et al. |
| 2012/0001252 A1* | 1/2012 | Alsmeier .......... H01L 27/11551 257/321 |
| 2012/0181596 A1 | 7/2012 | Liu |

(Continued)

FOREIGN PATENT DOCUMENTS

| CN | 101026193 A | 8/2007 |
| CN | 102683291 A | 9/2012 |

(Continued)

OTHER PUBLICATIONS

Notice of Allowance for U.S. Appl. No. 14/140,215 dated Aug. 19, 2015, 10 pages.

(Continued)

*Primary Examiner* — Sitaramarao S Yechuri
(74) *Attorney, Agent, or Firm* — Thorpe North and Western, LLP; David W. Osborne (57) ABSTRACT

A 3D NAND memory structure having improved process margin and enhanced performance is provided. Such a memory structure can include a control gate material and a floating gate material disposed between a first insulating layer and a second insulating layer, a metal layer disposed between the control gate material and the floating gate material, an interpoly dielectric (IPD) layer disposed between the metal layer and the control gate material such that the IPD layer electrically isolates the control gate material from the floating gate material, and a tunnel dielectric material coupled to the floating gate material opposite the control gate material.

24 Claims, 7 Drawing Sheets

(56) References Cited

U.S. PATENT DOCUMENTS

| | | |
|---|---|---|
| 2012/0217564 A1 | 8/2012 | Tang et al. |
| 2012/0231593 A1 | 9/2012 | Joo et al. |
| 2012/0267699 A1 | 10/2012 | Kiyotoshi |
| 2013/0001667 A1* | 1/2013 | Lu .................. H01L 27/11521 257/315 |
| 2013/0082316 A1 | 4/2013 | Son et al. |
| 2013/0307047 A1 | 11/2013 | Sakuma et al. |
| 2014/0160841 A1 | 6/2014 | Koval |
| 2014/0203344 A1 | 7/2014 | Hopkins et al. |
| 2015/0041879 A1 | 2/2015 | Jayanti et al. |

FOREIGN PATENT DOCUMENTS

| | | | |
|---|---|---|---|
| CN | 102959693 | A | 3/2013 |
| JP | 2007134681 | A | 5/2007 |
| JP | 2007294928 | A | 11/2007 |
| JP | 2008047704 | A | 2/2008 |
| JP | 2009141354 | A | 6/2009 |
| JP | 2010034112 | A | 2/2010 |
| JP | 2011066417 | A | 2/2010 |
| JP | 2013157074 | A | 8/2013 |
| JP | 2013534058 | A | 8/2013 |
| JP | 2014509454 | A | 8/2013 |
| JP | 2016514371 | A | 5/2016 |
| KR | 10-20070041374 | A | 4/2007 |
| KR | 10-2008-0043107 | A | 5/2008 |
| KR | 10-20100005604 | A | 1/2010 |
| KR | 10-2012-0101818 | A | 9/2012 |
| KR | 10-2013-0127793 | A | 11/2013 |
| TW | I321851 | B | 3/2010 |
| TW | 201214631 | A | 4/2012 |
| WO | WO 2012003301 | A2 | 1/2012 |
| WO | WO 2014149740 | A1 | 9/2014 |

OTHER PUBLICATIONS

Search Report for International application PCT/US2014/065957, dated Feb. 24, 2015, 10 pages.
Search Report for International application PCT/US2014/067134, dated Feb. 26, 2015, 10 pages.
U.S. Appl. No. 14/140,215 filed Dec. 24, 2013, John D. Hopkins.
Taiwan search report from foreign office action dated Apr. 27, 2016 in Taiwan (R.O.C.) Patent Application No. 103139555; filed Dec. 17, 2013; 2 pages (English translation included).

* cited by examiner

METAL FLOATING GATE COMPOSITE 3D NAND MEMORY DEVICES AND ASSOCIATED METHODS

BACKGROUND

Memory structures are integrated circuits that provide data storage to a variety of electronics devices. Memory can include volatile memory structures that lose stored information when not powered (e.g., RAM-Random Access Memory), and non-volatile memory structure that retain stored information even when not powered. One example of such non-volatile memory is flash memory. Non-volatile flash memory can be used in a variety of portable devices, and can be beneficial for use when transferring data from one electronic device to another where power is not supplied during the physical transfer.

DESCRIPTION OF EMBODIMENTS

Although the following detailed description contains many specifics for the purpose of illustration, a person of ordinary skill in the art will appreciate that many variations and alterations to the following details can be made and are considered to be included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," it is understood that direct support should be afforded also to "consisting essentially of" language as well as "consisting of" language as if stated explicitly.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles.

In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific technology embodiments are then described in further detail. This initial summary is intended to aid readers in understanding the technology more quickly but is not intended to identify key or essential features of the technology, nor is it intended to limit the scope of the claimed subject matter.

3D NAND memory generally includes a plurality of memory cells that include floating-gate transistors. Present 3D NAND memory cells can include a plurality of NAND memory structures arranged in three dimensions around a central cell pillar. A memory structure can generally include a floating gate that is electrically isolated from a supporting semiconductor substrate by a thin dielectric layer called a tunnel dielectric layer (i.e. tunnel oxide layer). A conductive material (i.e. a control gate) is positioned adjacent to the floating gate and electrically isolated therefrom by an interpoly dielectric (IPD) layer. The inter-poly dielectric can be a layered structure, and in some aspects can include a silicon nitride layer sandwiched between two layers of silicon oxide. The floating gate is generally comprised of a conductive material that serves as a charge storage element for electrical charge. This charge storage element defines the memory state of the particular transistor to which it is associated. The floating gate is electrically isolated from surrounding conductive materials, and thus charge stored therein remains even when power to the device is discontinued.

It has been discovered in various 3D NAND technologies conductive material from the floating gate can break free during manufacture and accumulate at the bottom of the cell pillar. This can cause electrical shorting, thus lowering the efficiency of the device. By associating a metal layer with the floating gate material during manufacture, defects and debris at or near the bottom of the cell pillar can be reduced or eliminated, thus increasing the efficiency and performance of the device.

Figure 1:
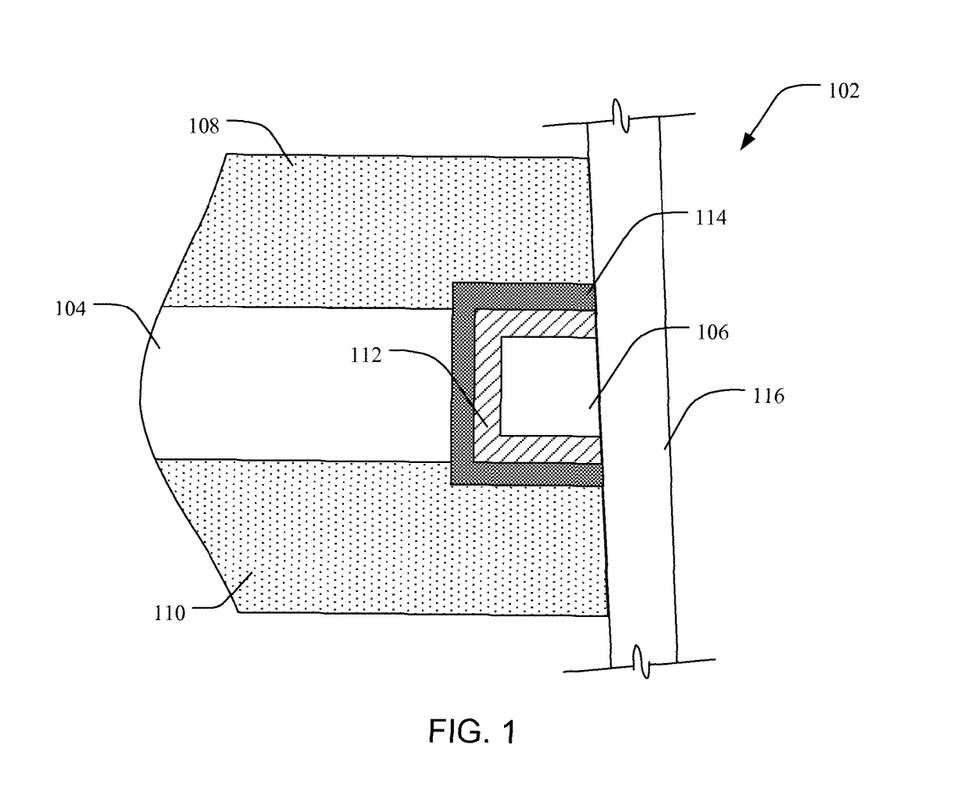
FIG. 1 is a schematic view of a section of a memory structure in accordance with an invention embodiment.

Accordingly, in one aspect as is shown in FIG. 1, a NAND memory structure 102 having an improved process margin and enhanced performance is provided. The memory structure can include a control gate material 104 and a floating gate material 106 disposed between a first insulating layer 108 and a second insulating layer 110. A metal layer 112 is positioned between the control gate material 104 and the floating gate material 106 such that the metal layer 112 is disposed along or wrapped around at least three sides of the floating gate material 106. An interpoly dielectric (IPD) layer 114 is disposed between the metal layer 112 and the control gate material 104 such that the IPD layer 114 electrically isolates the control gate material 104 from the floating gate material 106. The IPD layer 114 is disposed along or wrapped around at least three sides of the metal layer 112. The structure can further include a tunnel dielectric material 116 coupled to the floating gate material 106 opposite the control gate material 104. In another aspect, the metal layer 112 can be disposed along or wrapped around at least four sides of the floating gate material 106. In yet another aspect, the IPD layer 114 can be disposed along or wrapped around at least four sides of the metal layer 112.

Figure 2:
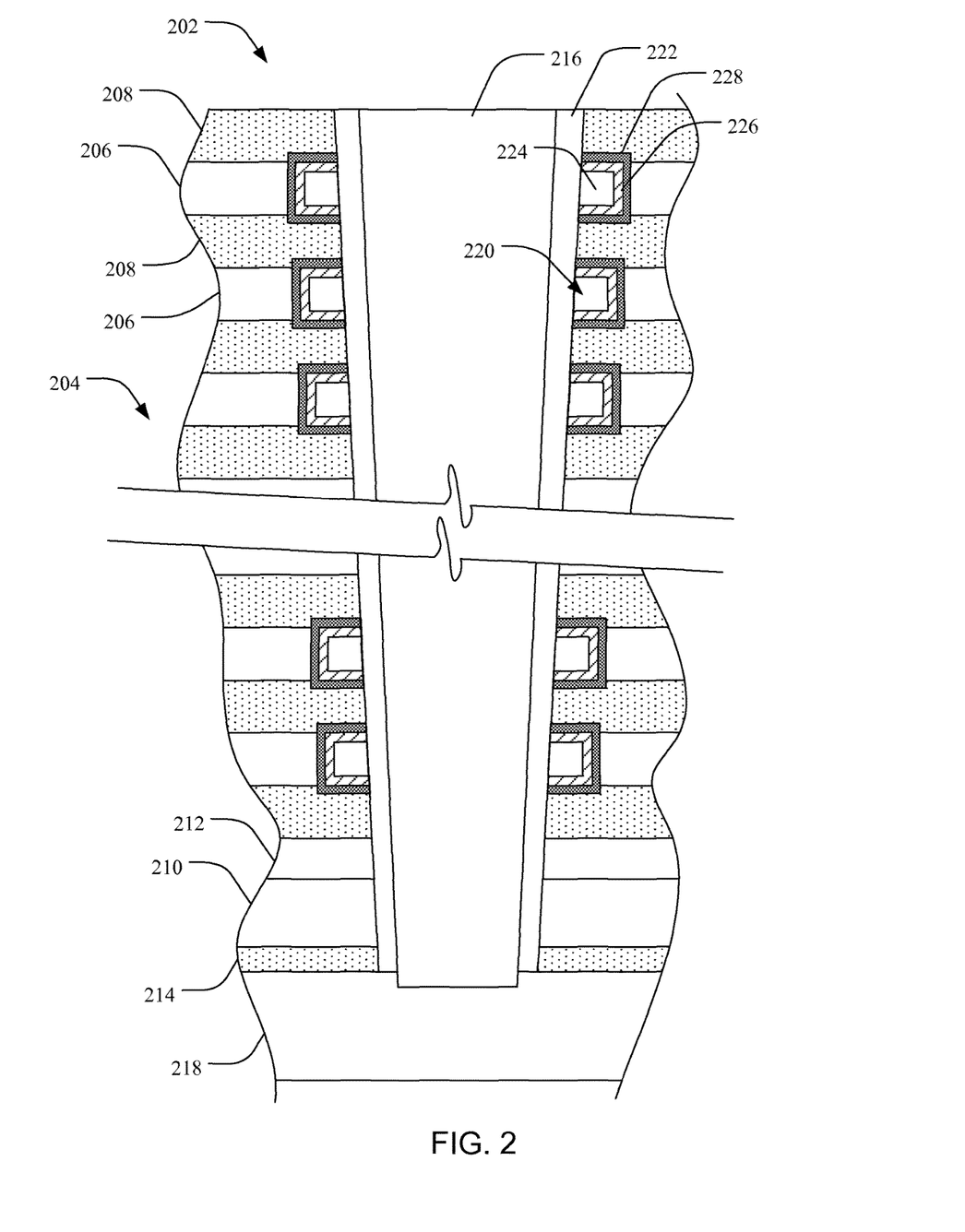
FIG. 2 is a schematic view of a section of an exemplary 3D NAND memory cell in accordance with an invention embodiment.

Such a NAND memory structure can be used as a single NAND device, or the memory structure can be incorporated into a device that includes a plurality of such structures. Furthermore, the particular architectural layouts described herein should not be seen as limiting, and it is to be understood that other architectures are contemplated for integrating a plurality of such memory structures into a device. In one aspect, as is shown in FIG. 2 for example, a 3D NAND memory cell 202 having an improved process margin and enhanced performance is therefore provided. Such a memory cell can include a cell stack substrate 204 having alternating layers of conducting material 206 and insulating material 208 disposed on a select gate source (SGS) region 210. In some aspects, the SGS region is disposed between an etch stop layer 212 and an additional insulating layer 214. A cell pillar 216 can be positioned within the cell stack substrate 204 in a substantially perpendicular orientation with respect to the plurality of alternating layers 206, 208. The cell pillar extends through the SGS region into an underlying source layer 218. Furthermore, a plurality of NAND memory structures 220 are arranged in a three dimensional configuration around the cell pillar 216. The plurality of NAND memory structures 220 are aligned with to the conductive material layers 206 of the cell stack substrate 204. In one aspect the conductive material layers 206 can function as control gate material, while in other aspects a separate control gate material can be positioned between the conductive material layer and the NAND memory structure.

A tunnel dielectric material 222 can be positioned between the cell stack substrate 204 and the cell pillar 216, thus electrically isolating the NAND memory structures 220 from the cell pillar 216. Each NAND memory structure includes a floating gate material 224 disposed between insulating material layers 208 and aligned with a conductive material layer 206. A metal layer 226 is positioned between the conductive material layer 206 (or control gate) and the floating gate material 224 such that the metal layer 226 is disposed along or wrapped around at least three sides of the floating gate material 224. An interpoly dielectric (IPD) layer 228 is disposed between the metal layer 226 and the conductive material layer 206 such that the IPD layer 228 electrically isolates the conductive material layer 206 from the floating gate material 224. The IPD layer 228 is disposed along or wrapped around at least three sides of the metal layer 226. In another aspect, the metal layer 226 can be disposed along or wrapped around at least four sides of the floating gate material 224. In yet another aspect, the IPD layer 228 can be disposed along or wrapped around at least four sides of the metal layer 226.

Figure 3:
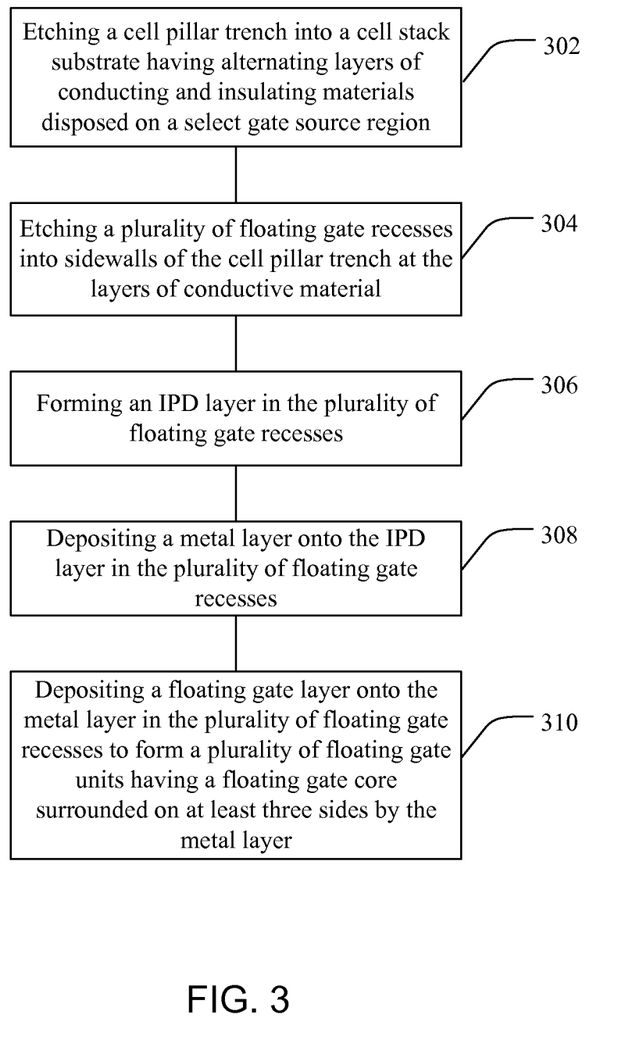
FIG. 3 is a flow diagram of a method of making a 3D NAND memory cell in accordance with an invention embodiment.

In another aspect, a method of making a 3D NAND memory structure having an improved process margin and enhanced performance is provided. As is shown in FIG. 3, such a method can include 302 etching a cell pillar trench into a cell stack substrate having alternating layers of conducting and insulating materials disposed on a select gate source region, 304 etching a plurality of floating gate recesses into sidewalls of the cell pillar trench at the layers of conductive material, and 306 forming an interpoly dielectric (IPD) layer in the plurality of floating gate recesses. The method can further include 308 depositing a metal layer onto the IPD layer in the plurality of floating gate recesses, and 310 depositing a floating gate layer onto the metal layer in the plurality of floating gate recesses to form a plurality of floating gate units having a floating gate core surrounded on at least three sides by the metal layer.

Figure 4A:
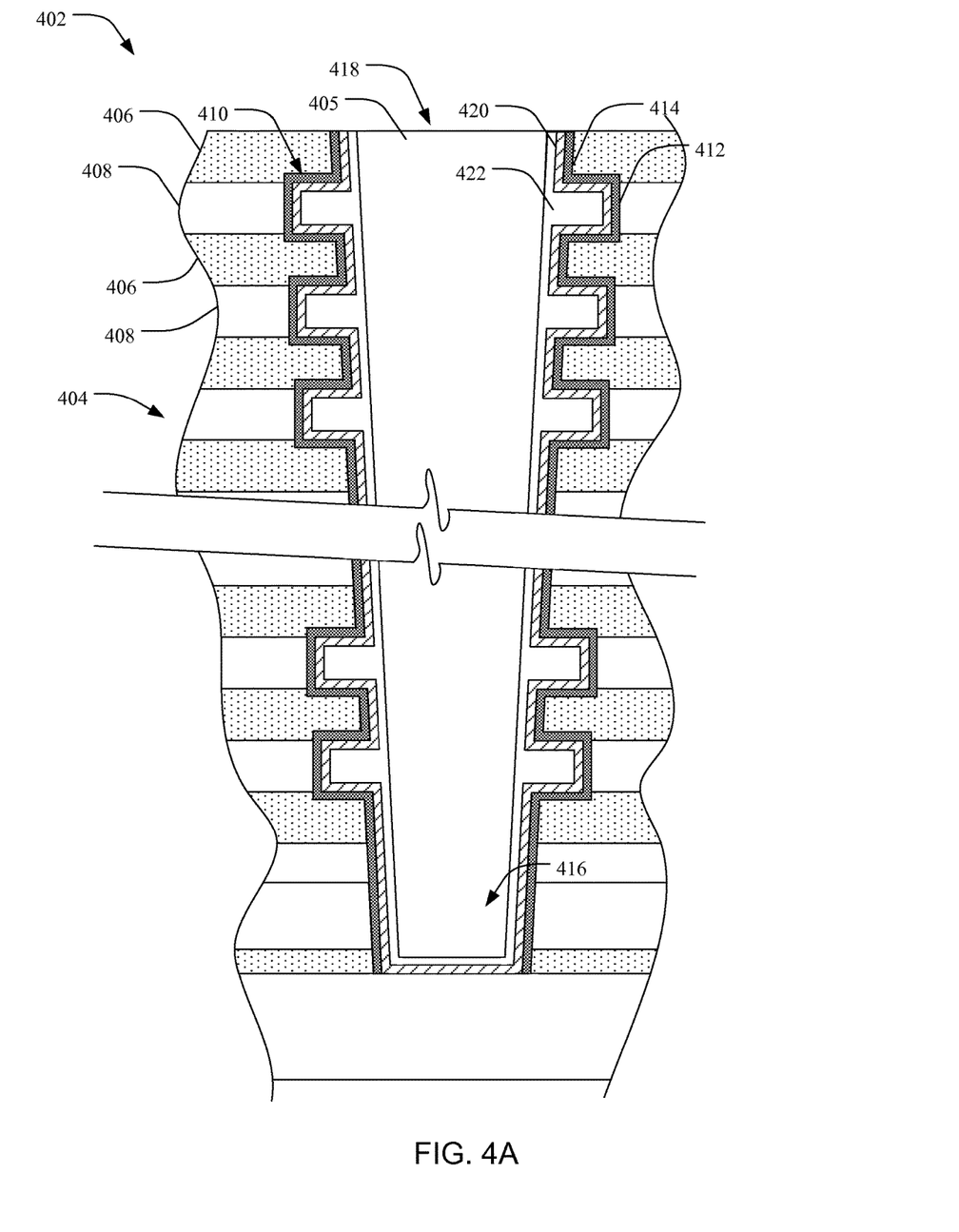
FIG. 4A is a schematic view of a section of a 3D NAND memory cell during manufacture in accordance with an invention embodiment.

In another aspect, as is shown in FIG. 4A, a 3D NAND memory structure 402 is shown in the process of being made. A cell pillar trench 405 has been etched into a cell stack substrate 404. The cell stack substrate 404 includes a plurality of alternating insulating 406 and conducting 408 material layers. A plurality of floating gate recesses have been etched into the sidewalls of the cell pillar trench 405 at the conductive material layers 408. Thus the floating gate recesses 410 are isolated from one another by the insulating material layers 406.

FIG. 4A also shows an IPD layer 412 formed in the floating gate recesses 410. In some aspects the IPD layer is formed along the sidewalls 414 of the cell pillar trench 405, and thus forms a continuous IPD layer from the bottom 416 of the cell pillar trench 405 to the top 418. In other aspects, the IPD layer is discontinuous at this stage of manufacture. The IPD layer can be made of any known material useful for such a material. In one aspect the IPD layer can be a layered structure comprised of a silicon nitride layer disposed between two layers of silicon oxide. This tri-layer is known in the art as an "ONO" or "Oxide-Nitride-Oxide" layer. Note that the IPD layer 412 is positioned to electrically isolate materials subsequently deposited into the floating gate recess 410 from the conducting material layer 408.

A metal layer 420 is shown deposited on the IPD layer 412 in the floating gate recesses 410. In some aspects the metal layer 420 is deposited along the IPD layer 412 from the bottom 416 to the top 418 of the cell pillar trench 405, and thus forms a continuous layer. In other aspects the metal layer is discontinuous at this stage of manufacture. In one aspect, the metal layer 420 can be deposited along the bottom 416 of the cell pillar trench 405. The metal layer can be any metal material having beneficial properties in the manufacture or use of a 3D NAND memory cell or structure. In one aspect, the metal layer can be a metal nitride. In another aspect, non-limiting examples of metal layer material can include TiN, TiCN, TaN, TiSiN, WSix, RuTiN, $RuO_x$, TaSiN, TaCON, TiCON, $W_xN_x$ and the like, including appropriate combinations thereof. In yet another aspect, the metal layer can be TiN. While the thickness of the metal layer can vary depending on the architecture of the device, in one aspect the metal layer can have a thickness of from about 1 nm to about 6 nm. In another embodiment, the thickness can be about 3 nm. In yet another aspect, the metal layer can have a thickness of from about 15% to about 30% of the thickness of the conductive material layer 408. Additionally, the metal layer can be formed according to any known technique, including, without limitation, chemical vapor deposition, physical vapor deposition, atomic layer deposition, and the like.

FIG. 4A also shows a floating gate layer (or material) 422 deposited on the metal layer 420 in the floating gate recesses 410. In some aspects the floating gate layer 422 is deposited along the metal layer 420 from the bottom 416 to the top 418 of the cell pillar trench 405, and thus forms a continuous layer. In other aspects the floating gate layer is discontinuous at this stage of manufacture. In one aspect, the floating gate layer 422 can be deposited on the metal layer 420 along the bottom 416 of the cell pillar trench 405. Thus, the floating gate material in the floating gate recess 410 is surrounded on at least three sides by the metal layer, and in some aspects is surrounded on at least 4 sides or 5 sides by the metal layer. In other words, the metal layer can "wrap around" the floating gate material in the floating gate recess to differing degrees depending on the architecture of the device. Similarly, in some aspects the metal layer in the floating gate recess is surrounded on at least three sides by the IPD layer, and in some aspects is surrounded on at least 4 sides or 5 sides by the IPD layer. Such can also be described as the IPD layer "wrapping around" the metal layer to differing degrees. It is noted that the floating gate material can be any material useful in creating a floating gate. In one specific aspect, the floating gate material can be polysilicon.

Figure 4B:
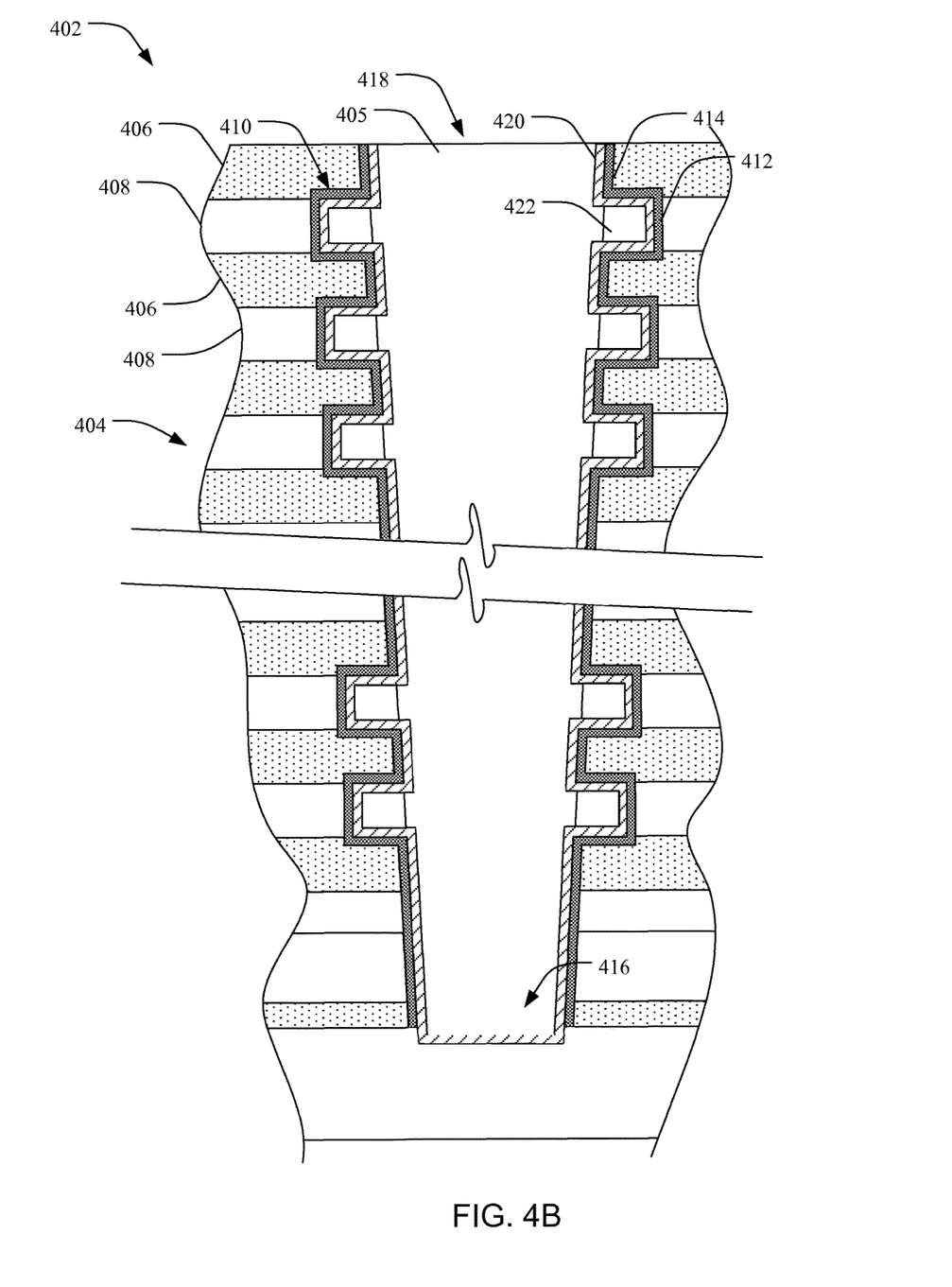
FIG. 4B is a schematic view of a section of a 3D NAND memory cell during manufacture in accordance with an invention embodiment.

Turning to FIG. 4B, the floating gate layer 422 can be etched from the sidewalls and bottom 416 of the cell pillar trench 405 to expose the metal layer 420. In some cell structures lacking the metal layer, debris and other residual defects from the floating gate material can be present at the bottom of the cell pillar trench due to incomplete floating gate etching. Such debris and residual defects can negatively affect the performance of the memory cell. While such defects can be reduced through cleaning and further etching, this further etching often results in undesirable erosion of the floating gates, particularly in the upper floating gate tiers near the top of the cell pillar trench. The metal layer 420 positioned beneath the floating gate material 422 allows a more aggressive etching of the floating gate material, particularly at the bottom 416 of the cell pillar trench 405 and the bottom corner areas that are traditionally difficult to clean. As such all or substantially all of the debris and residual defects can be eliminated by such a cleaning process, as well as increasing the process margin gain.

The floating gate layer 422 can be etched according to any process that selectively etches the floating gate polysilicon material without significantly etching the underlying metal layer. Various wet and dry cleaning methods are known in the art. In some exemplary aspects, a conventional wet DHF (dilute hydrofluoric acid) etching or cleaning etch process can be used. In other aspects, a dry etching or cleaning process can be used such as, without limitation, a plasma-free gas chemical etch system targeted at selective oxide film etching using a Certas machine available from Tokyo Electron Limited (TEL) of Japan, or a SiCoNi etching process using a machine from Applied Materials of Santa Clara, Calif. using HF+NH3 vapor/HF+NH3 plasma. In one specific aspect, the floating gate material can be etched with TMAH (Tetramethylammonium hydroxide) from 0.5% to 10% in the temperature of 10 C to 100 C using a Certas machine. One exemplary chemistry includes <10% TMAH, <2% of a nonionic surfactant, pH buffers for a range of 8-10, and optional chelating and/or complexing agents.

Figure 4C:
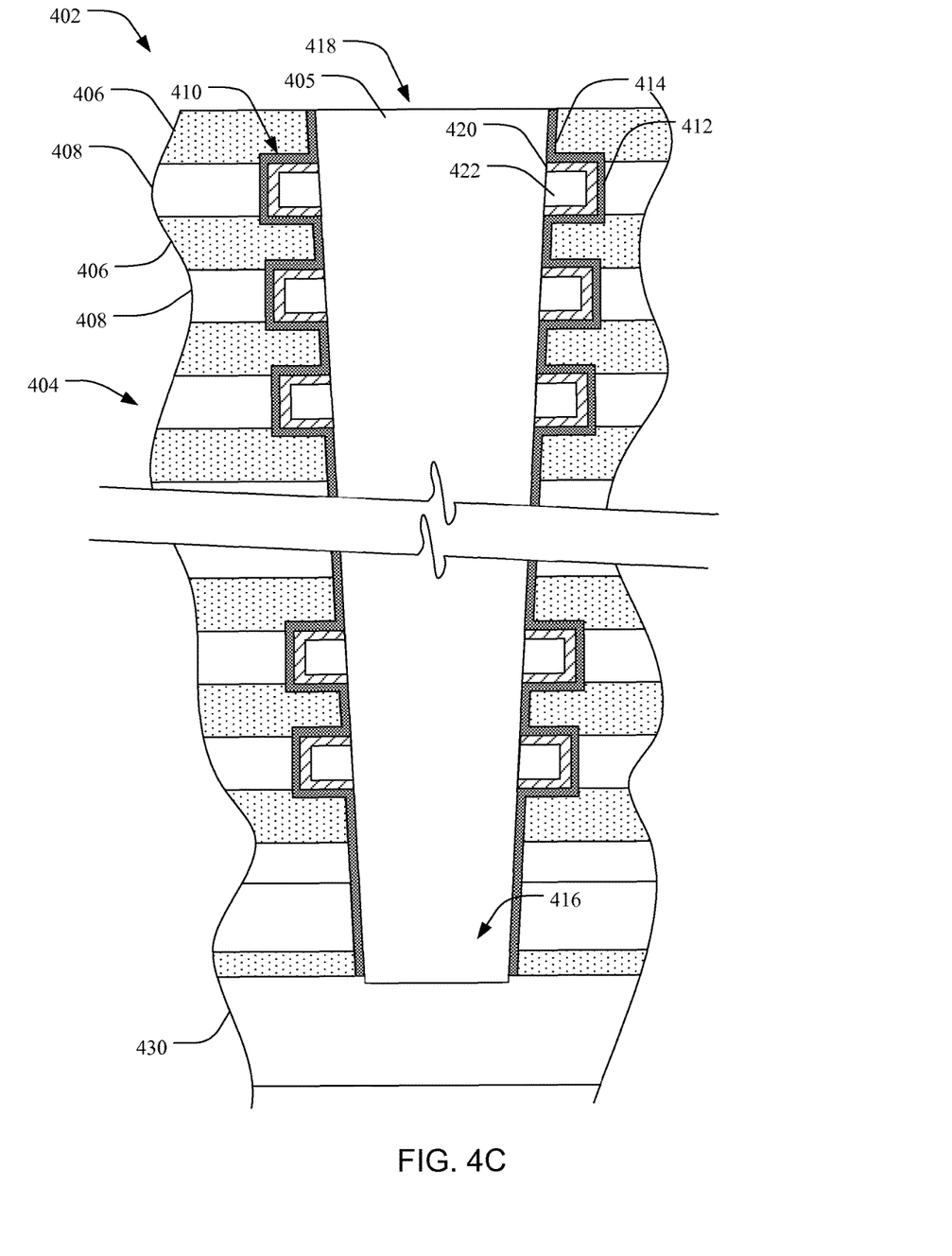
FIG. 4C is a schematic view of a section of a 3D NAND memory cell during manufacture in accordance with an invention embodiment.

Following etching of the floating gate layer 422, the metal layer 420 can be etched from the sidewalls and bottom 416 of the cell pillar trench 405 with an appropriate etch, as is shown in FIG. 4C. This cleaning step can further clean the debris and residual defects from the bottom and bottom corners of the cell pillar trench. In one aspect, for example, the metal layer 420 can be etched sufficiently deep into the bottom 416 of the cell pillar trench 405 to eliminate substantially all or all floating gate material. The etch used can vary depending on the metal material used in the metal layer. In the case of a TiN metal layer, for example, an SC1 chemistry can be useful. SC1 chemistries are well known, and often include a solution of $NH_4OH$, $H_2O_2$, and deionized water. One exemplary chemistry includes 28% $NH_4OH$, 30% $H_2O_2$, and dionized water in a 1:1:5 ratio at 70 C. In another aspect, an APM etch can be utilized. For example, one formula may be deionized water, H2O2, and NH4OH mixed at a ratio of 100:3:2, at temperature of 55 C. Other chemicals that can etch metals include without limitation, hot phosphoric acid, HF/O3, HF/H2O2, HF Vapor, NH3 Vapor, and H2SO4/H2O2, HF/HNO3. Note that the metal layer etch exposes the IPD layer along the sidewalls and well-defined floating gate 422 and metal layer 422 regions in the floating gate recesses. The metal layer etch can expose the source 430 at the bottom 416 of the cell pillar trench 405.

It is noted that a variety of techniques can be utilized to detect residual defects and debris in the cell pillar trench. Such defects and debris can cause electrical shorting once the cell pillar trench is filled with the cell pillar material. As such, these shorts can be detected and the defect count can be quantified. A memory cell can also be imaged and visually inspected for defects using SEM or other appropriate techniques.

Figure 4D:
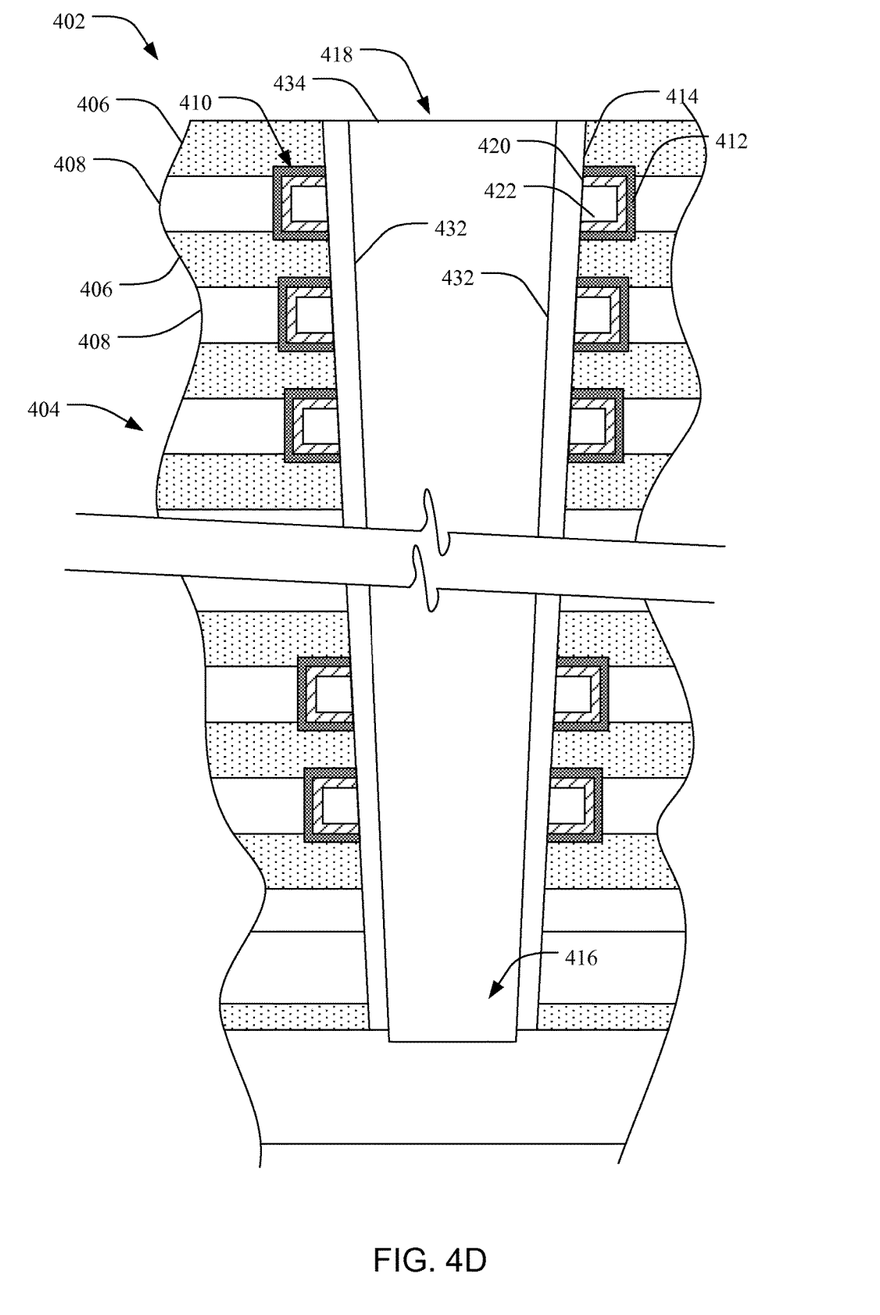
FIG. 4D is a schematic view of a section of a 3D NAND memory cell during manufacture in accordance with an invention embodiment.

As is shown in FIG. 4D, the IPD layer 412 is etched away to expose the sidewalls of the cell pillar trench 405. A tunnel dielectric (i.e. tunnel oxide) 432 can then be formed along the sidewalls of the trench. Tunnel dielectrics are well known, and can be any insulating material that functions as a tunnel dielectric. Non-limiting examples can include oxides and nitrides such as $SiO_2$, SiON, and the like. In one aspect the tunnel dielectric can be an oxide that has been treated to allow uniform growth on metal materials. In one specific aspect the tunnel dialectic can be a DEP poly liner (30A) that has been in situ steam generation (ISSG) oxidized. Following formation of the tunnel dielectric, a liner layer (not shown) can be formed on the tunnel dialectic and the bottom 416 of the cell pillar trench 405 can be punch-etched through the liner layer and the tunnel dielectric 432 to expose the source layer 430. A cell pillar 434 can subsequently be deposited into and thus fill the cell pillar trench 405. In one non-limiting aspect, the cell pillar 434 can be a polysilicon material.

Resulting devices and structures can demonstrate a variety of improved performance characteristics, which can be attributed, at least in part, to the presence of the metal layer/floating gate composite material and the improved cleaning and elimination of residual defects at the bottom of the cell pillar trench. For example, in one aspect such a 3D NAND memory cell can have a program/erase window of from about 8 V to about 15 V. In another aspect, the window can be from about 10v to about 13v. In yet another aspect, the window can be from about 8v to about 13v. In another aspect, the 3D NAND memory structure can have a cycling endurance of from about 500 cycles to about 10,000 cycles. In another aspect, the endurance may be from about 750 to about 8000. In yet another aspect, the endurance may be from about 500 to about 5000 cycles.

In another example, the devices and structures described herein can have a program slope that is improved compared to other devices or structures. In one embodiment, the slope may be from about 0.6 V to about 1V. In another aspect, the slope may be from about 0.8V to about 1 V.

In one example, a method of making a 3D NAND memory structure can include etching a cell pillar trench into a cell stack substrate having alternating layers of conducting and insulating materials disposed on a select gate source region; etching a plurality of floating gate recesses into sidewalls of the cell pillar trench at the layers of conductive material; forming an interpoly dielectric (IPD) layer in the plurality of floating gate recesses; depositing a metal layer onto the IPD layer in the plurality of floating gate recesses; and depositing a floating gate layer onto the metal layer in the plurality of floating gate recesses to form a plurality of floating gate units having a floating gate core surrounded on at least three sides by the metal layer.

In one example, the memory structure can provide improved process margin and enhanced performance as compared to structures without a metal layer.

In one example, the plurality of floating gate units have a floating gate core surrounded on at least 4 sides by the metal layer.

In one example, forming the IPD layer in the plurality of floating gate recesses further includes forming the IPD along the sidewalls of the cell pillar trench.

In one example, depositing the metal layer onto the IPD layer in the plurality of floating gate recesses further includes depositing the metal layer along the sidewalls of the cell pillar trench.

In one example, depositing the floating gate layer onto the metal layer in the plurality of floating gate recesses further includes depositing the floating gate layer onto the metal layer along the sidewalls of the cell pillar trench.

In one example, the methods herein can further include etching the floating gate layer from the sidewalls of the cell pillar trench to expose the metal layer; and etching the metal layer from the sidewalls of the cell pillar trench to expose the IPD layer.

In one example, the methods herein can further include etching the IPD layer from the sidewalls of the cell pillar trench to expose the cell stack substrate.

In one example, etching the metal layer exposes a portion of a source material positioned below the select gate source region of the substrate and opposite the alternating layers of conducting and insulating materials.

In one example, etching the metal layer further removes residual defects from a bottom end of the cell pillar trench.

In one example, etching the metal layer further comprises etching the metal layer sufficiently deep to eliminate substantially all floating gate material from a bottom end of the cell pillar trench.

In one example, etching the metal layer further comprises etching the metal layer sufficiently deep to eliminate all floating gate material from a bottom end of the cell pillar trench.

In one example, the methods herein can further include forming a tunnel dielectric layer along the sidewalls of the cell pillar trench; forming a liner layer on the tunnel dielectric layer along the sidewalls of the cell pillar trench; punch etching a bottom side of the cell pillar trench through the liner layer and through the tunnel dielectric layer to expose a source layer of the substrate; and filling the cell pillar trench to form a cell pillar.

In one example, filling the cell pillar trench further includes filling the cell pillar trench with a polysilicon material.

In one example, the metal layer includes a material selected from the group consisting of TiN, TiCN, TaN, TiSiN, WSix, RuTiN, RuOx, TaSiN, TaCON, TiCON, WxNx, and combinations thereof.

In one example, the metal layer is TiN.

In one example, the metal layer has a thickness of from about 1 nm to about 5 nm.

In one example, the metal layer has a thickness of from about 15% to about 30% of the thickness of the layer of conductive material.

In one example, a NAND memory structure having improved process margin and enhanced performance can include, a control gate material and a floating gate material disposed between a first insulating layer and a second insulating layer; a metal layer disposed between the control gate material and the floating gate material, wherein the metal layer is disposed along at least 3 sides of the floating gate material; an interpoly dielectric (IPD) layer disposed between the metal layer and the control gate material such that the IPD layer electrically isolates the control gate material from the floating gate material, wherein the IPD layer is disposed along at least 3 sides of the metal layer; and a tunnel dielectric material coupled to the floating gate material opposite the control gate material.

In one example, the metal layer is disposed along at least 4 sides of the floating gate material.

In one example, the IPD layer is disposed along at least 4 sides of the metal layer.

In one example, the metal layer includes a material selected from the group consisting of TiN, TiCN, TaN, TiSiN, WSix, RuTiN, RuOx, TaSiN, TaCON, TiCON, and combinations thereof.

In one example, the metal layer is TiN.

In one example, the metal layer has a thickness of from about 1 nm to about 5 nm.

In one example, a 3D NAND memory cell having improved process margin and enhanced performance can include a cell stack substrate having alternating layers of conducting and insulating materials disposed on a select gate source region; a cell pillar positioned within the substrate in a substantially perpendicular orientation with respect to the plurality of alternating layers; and a plurality of NAND memory structures of as recited herein in a three dimensional configuration around the cell pillar, wherein the plurality of NAND memory structures are aligned with and electrically coupled to the conductive material layers.

In one example, the plurality of NAND memory structures are arranged in columns around the cell pillar.

In one example, a bottom end of the cell pillar contains substantially no residual defects.

In one example, bottom end of the cell pillar contains no residual defects.

In one example, the memory cell has a program/erase window is from about 8 V to about 15 V.

In one example, the memory cell has a program slope is from about 0.6V to about 1.0V.

In one example, the memory cell has a cycling endurance of from about 500 cycles to about 10,000 cycles.

In one example, the memory cell has a cycling endurance of from about 500 to 5000 cycles.

While the forgoing examples are illustrative of the specific embodiments in one or more particular applications, it will be apparent to those of ordinary skill in the art that numerous modifications in form, usage and details of implementation can be made without departing from the principles and concepts articulated herein. Accordingly, no limitation is intended except as by the claims set forth below.

What is claimed is:

1. A method of making a 3D NAND memory structure having improved process margin and enhanced performance, comprising:
    etching a cell pillar trench into a cell stack substrate having alternating layers of conducting and insulating materials disposed on a select gate source region;
    etching a plurality of floating gate recesses into sidewalls of the cell pillar trench at the layers of conductive material;
    forming an interpoly dielectric (IPD) layer in the plurality of floating gate recesses;
    depositing a metal layer onto the IPD layer in the plurality of floating gate recesses;
    depositing a floating gate layer onto the metal layer in the plurality of floating gate recesses to form a plurality of floating gate units having a floating gate core surrounded on at least three sides by the metal layer.

2. The method of claim 1, wherein the plurality of floating gate units have a floating gate core surrounded on at least 4 sides by the metal layer.

3. The method of claim 1, wherein:
    forming the IPD layer in the plurality of floating gate recesses further includes forming the IPD along the sidewalls of the cell pillar trench;
    depositing the metal layer onto the IPD layer in the plurality of floating gate recesses further includes depositing the metal layer along the sidewalls of the cell pillar trench; and
    depositing the floating gate layer onto the metal layer in the plurality of floating gate recesses further includes depositing the floating gate layer onto the metal layer along the sidewalls of the cell pillar trench.

4. The method of claim 3, further comprising:
    etching the floating gate layer from the sidewalls of the cell pillar trench to expose the metal layer; and
    etching the metal layer from the sidewalls of the cell pillar trench to expose the IPD layer.

5. The method of claim 4, further comprising etching the IPD layer from the sidewalls of the cell pillar trench to expose the cell stack substrate.

6. The method of claim 4, wherein etching the metal layer exposes a portion of a source material positioned below the select gate source region of the substrate and opposite the alternating layers of conducting and insulating materials.

7. The method of claim 6, wherein etching the metal layer further removes residual defects from a bottom end of the cell pillar trench.

8. The method of claim 6, wherein etching the metal layer further comprises etching the metal layer sufficiently deep to eliminate substantially all floating gate material from a bottom end of the cell pillar trench.

9. The method of claim 6, wherein etching the metal layer further comprises etching the metal layer sufficiently deep to eliminate all floating gate material from a bottom end of the cell pillar trench.

10. The method of claim 1, further comprising:
forming a tunnel dielectric layer along the sidewalls of the cell pillar trench;
forming a liner layer on the tunnel dielectric layer along the sidewalls of the cell pillar trench;
punch etching a bottom side of the cell pillar trench through the liner layer and through the tunnel dielectric layer to expose a source layer of the substrate; and
filling the cell pillar trench to form a cell pillar.

11. The method of claim 10, wherein filling the cell pillar trench further includes filling the cell pillar trench with a polysilicon material.

12. The method of claim 1, wherein the metal layer includes a material selected from the group consisting of TiN, TiCN, TaN, TiSiN, WSix, RuTiN, RuOx, TaSiN, TaCON, TiCON, $W_xN_x$, and combinations thereof.

13. The method of claim 1, wherein the metal layer is TiN.

14. The method of claim 1, wherein the metal layer has a thickness of from about 1 nm to about 5 nm.

15. The method of claim 1, wherein the metal layer has a thickness of from about 15% to about 30% of the thickness of the layer of conductive material.

16. A NAND memory structure, comprising:
a control gate material and a floating gate material disposed between a first insulating layer and a second insulating layer;
a metal layer disposed between the control gate material and the floating gate material, wherein the metal layer is disposed along at least 3 sides of the floating gate material;
an interpoly dielectric (IPD) layer disposed between the metal layer and the control gate material such that the IPD layer electrically isolates the control gate material from the floating gate material, wherein the IPD layer is disposed along at least 3 sides of the metal layer; and
optionally, a tunnel dielectric material coupled to the floating gate material opposite the control gate material.

17. The structure of claim 16, wherein the metal layer is disposed along at least 4 sides of the floating gate material.

18. The structure of claim 17, wherein the IPD layer is disposed along at least 4 sides of the metal layer.

19. The structure of claim 16, wherein the metal layer includes a material selected from the group consisting of TiN, TiCN, TaN, TiSiN, WSix, RuTiN, RuOx, TaSiN, TaCON, TiCON, and combinations thereof.

20. The structure of claim 16, wherein the metal layer is TiN.

21. The structure of claim 16, wherein the metal layer has a thickness of from about 1 nm to about 5 nm.

22. A 3D NAND memory cell, comprising:
a cell stack substrate having alternating layers of conducting and insulating materials disposed on a select gate source region;
a cell pillar positioned within the substrate in a substantially perpendicular orientation with respect to the plurality of alternating layers; and
a plurality of NAND memory structures of claim 16 arranged in a three dimensional configuration around the cell pillar, wherein the plurality of NAND memory structures are aligned with and electrically coupled to the conductive material layers.

23. The memory cell of claim 22, wherein the plurality of NAND memory structures are arranged in columns around the cell pillar.

24. The memory cell of claim 22, wherein the memory cell has either a program/erase window of from about 8 V to about 15 V, or a program slope of from about 0.6V to about 1.0V, or a cycling endurance of from about 500 cycles to about 10,000 cycles, or a cycling endurance of from about 500 to 5000 cycles, a combination thereof.

* * * * *